(12) United States Patent
Zhang et al.

(10) Patent No.: US 11,422,420 B2
(45) Date of Patent: Aug. 23, 2022

(54) ARRAY SUBSTRATE AND DISPLAY PANEL

(71) Applicant: Shenzhen China Star Optoelectronics Semiconductor Display Technology Co., Ltd., Guangdong (CN)

(72) Inventors: Xin Zhang, Guangdong (CN); Zhenghua Li, Guangdong (CN); Ilgon Kim, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 177 days.

(21) Appl. No.: 16/771,256

(22) PCT Filed: Apr. 21, 2020

(86) PCT No.: PCT/CN2020/085966
§ 371 (c)(1),
(2) Date: Jun. 10, 2020

(87) PCT Pub. No.: WO2021/189575
PCT Pub. Date: Sep. 30, 2021

(65) Prior Publication Data
US 2022/0113600 A1  Apr. 14, 2022

(30) Foreign Application Priority Data

Mar. 22, 2020 (CN) .......................... 202010204844.3

(51) Int. Cl.
*G02F 1/1362* (2006.01)
*G02F 1/1343* (2006.01)
(Continued)

(52) U.S. Cl.
CPC .. *G02F 1/136286* (2013.01); *G02F 1/134309* (2013.01); *G02F 1/136218* (2021.01);
(Continued)

(58) Field of Classification Search
CPC ............. G02F 1/1333; G02F 1/133345; G02F 1/1343; G02F 1/134309; G02F 1/13439;
(Continued)

(56) References Cited

U.S. PATENT DOCUMENTS

2007/0081105 A1* 4/2007 Park .................. G02F 1/136259
349/22
2007/0128551 A1  6/2007 Lee
(Continued)

FOREIGN PATENT DOCUMENTS

CN  102648436 A  8/2012
CN  202771133 U  3/2013
(Continued)

*Primary Examiner* — Thoi V Duong (57) ABSTRACT

An array substrate and a display panel are provided. In the array substrate, a shield electrode is located between adjacent pixel electrodes, an electrode main part of the shield electrode is located between the adjacent pixel electrodes, an extension part of the shield electrode extends from the electrode main part in a direction toward the adjacent pixel electrodes, a groove is formed in an insulating layer, the groove is formed between the electrode main part and the pixel electrodes, the extension part extends into the groove, and at least a part of a vertical projection of the extension part on a plane of data lines is located on an outside of the data lines.

18 Claims, 3 Drawing Sheets

(51) Int. Cl.
*G02F 1/1333* (2006.01)
*G02F 1/1335* (2006.01)
*H01L 27/12* (2006.01)

(52) U.S. Cl.
CPC ...... *G02F 1/136227* (2013.01); *H01L 27/124* (2013.01); *G02F 1/133345* (2013.01); *G02F 1/133514* (2013.01)

(58) Field of Classification Search
CPC ............ G02F 1/1362; G02F 1/136218; G02F 1/136286; G02F 1/136227; H01L 27/124
See application file for complete search history.

(56) References Cited

U.S. PATENT DOCUMENTS

2012/0081273 A1* 4/2012 Hsu ..................... G02F 1/1362
345/55
2012/0194573 A1 8/2012 Yamashita et al.

FOREIGN PATENT DOCUMENTS

| | | |
|---|---|---|
| CN | 107121864 A | 9/2017 |
| CN | 107329339 A | 11/2017 |
| CN | 108231850 A | 6/2018 |
| CN | 109188813 A | 1/2019 |
| CN | 209044244 U | 6/2019 |
| JP | H1020338 A | 1/1998 |
| JP | 2002250937 A | 9/2002 |
| JP | 2005316338 A | 11/2005 |

* cited by examiner

ARRAY SUBSTRATE AND DISPLAY PANEL

FIELD OF INVENTION

The present application relates to the field of display technology, and especially to an array substrate and a display panel.

BACKGROUND OF INVENTION

In a conventional array substrate, a coupling capacitor exists between a pixel electrode and a data line. However, because of a driving structure or manufacturing process variations, a polarity or capacitance of a coupling capacitor between a same data line and two pixel electrodes on two sides along the data line may be different, and therefore a vertical crosstalk (V-crosstalk) phenomenon occurs.

SUMMARY OF INVENTION

Embodiments of the present application provide an array substrate and a display panel to resolve a technical problem of vertical crosstalk existing in an array substrate of a conventional display panel.

Embodiments of the present application provides an array substrate that includes a base; a plurality of data lines disposed on the base; an insulating layer disposed on the data lines; a plurality of pixel electrodes disposed on the insulating layer; and a plurality of shield electrodes disposed in a same layer as the pixel electrodes, wherein the shield electrodes are located between adjacent pixel electrodes and disposed corresponding to the data lines, the shield electrodes include an electrode main part and an extension part, the electrode main part is located between adjacent ones of the pixel electrodes, and the extension part extends from the electrode main part in a direction toward the adjacent ones of the pixel electrodes; wherein a groove is formed in the insulating layer, the groove is located between the electrode main part and the pixel electrodes, the extension part extends into the groove, and at least a part of a vertical projection of the extension part on a plane of the data lines is located on an outside of the data lines.

In the array substrate according to embodiments of the present application, the extension part at least covers a lowest point of the groove.

In the array substrate according to embodiments of the present application, a free end part of the extension part is located at the lowest point of the groove.

In the array substrate according to embodiments of the present application, a shape and a size of each of the extension part is same.

In the array substrate according to embodiments of the present application, the shield electrodes and the pixel electrodes have a same material.

In the array substrate according to embodiments of the present application, the insulating layer is an organic insulating layer.

In the array substrate according to embodiments of the present application, a shape of a section of the groove is a circular arc.

In the array substrate according to embodiments of the present application, the plurality of data lines include a first data line and a second data line, and the plurality of pixel electrodes include a blue pixel electrode and a non-blue pixel electrode; the first data line is electrically connected to the blue pixel electrode, and the second data line is electrically connected to the non-blue pixel electrode; and the blue pixel electrode and the first data line electrically connected thereto have a first horizontal distance therebetween, the non-blue pixel electrode and an adjacent data line, and the blue pixel electrode and an adjacent second data line, have a second horizontal distance therebetween, respectively, and the first horizontal distance is greater than the second horizontal distance.

In the array substrate according to embodiments of the present application, a difference between the first horizontal distance and the second horizontal distance is between 0.1 um and 1 um.

In the array substrate according to embodiments of the present application, the non-blue pixel electrode is a red pixel electrode or a green pixel electrode, the plurality of data lines further includes a third data line, the second data line is electrically connected to one of the red pixel electrode and the green pixel electrode, and the third data line is electrically connected to the other of the red pixel electrode and the green pixel electrode.

The present application further relates to a display panel that includes an array substrate, and the array substrate is the array substrate according to the above-mentioned embodiments.

Specifically, the array substrate includes a base; a plurality of data lines disposed on the base; an insulating layer disposed on the data lines; a plurality of pixel electrodes disposed on the insulating layer; and a plurality of shield electrodes disposed in a same layer as the pixel electrodes, wherein the shield electrodes are located between adjacent pixel electrodes and disposed corresponding to the data lines, the shield electrodes include an electrode main part and an extension part, the electrode main part is located between adjacent ones of the pixel electrodes, and the extension part extends from the electrode main part in a direction toward the adjacent ones of the pixel electrodes; wherein a groove is formed in the insulating layer, the groove is located between the electrode main part and the pixel electrodes, the extension part extends into the groove, and at least a part of a vertical projection of the extension part on a plane of the data lines is located on an outside of the data lines.

In the display panel according to embodiments of the present application, the extension part at least covers a lowest point of the groove.

In the display panel according to embodiments of the present application, a free end part of the extension part is located at the lowest point of the groove.

In the display panel according to embodiments of the present application, a shape and a size of each of the extension part is same.

In the display panel according to embodiments of the present application, the shield electrodes and the pixel electrodes have a same material.

In the display panel according to embodiments of the present application, the insulating layer is an organic insulating layer.

In the display panel according to embodiments of the present application, a shape of a section of the groove is a circular arc.

In the display panel according to embodiments of the present application, the plurality of data lines include a first data line and a second data line, and the plurality of pixel electrodes include a blue pixel electrode and a non-blue pixel electrode; the first data line is electrically connected to the blue pixel electrode, and the second data line is electrically connected to the non-blue pixel electrode; and the blue pixel electrode and the first data line electrically connected thereto have a first horizontal distance therebetween, the non-blue pixel electrode and an adjacent data line, and the blue pixel electrode and an adjacent second data line, have a second horizontal distance therebetween, respectively, and the first horizontal distance is greater than the second horizontal distance.

In the display panel according to embodiments of the present application, a difference between the first horizontal distance and the second horizontal distance is between 0.1 um and 1 um.

In the display panel according to embodiments of the present application, the non-blue pixel electrode is a red pixel electrode or a green pixel electrode, the plurality of data lines further includes a third data line, the second data line is electrically connected to one of the red pixel electrode and the green pixel electrode, and the third data line is electrically connected to the other of the red pixel electrode and the green pixel electrode.

An array substrate and a display panel according to the present application adopt a groove formed in an insulating layer at a part between a shield main part and a pixel electrode, and an extension part of a shield electrode bends downward and covers at least a part of the groove. When data lines and pixel electrodes begin to operate, electric field lines are produced in a space between the data lines and the pixel electrodes, and the extension part is disposed in the electric field space, blocks transmission of at least a part of the electric lines, which decreases a capacitance coupling effect between the data lines and the pixel electrodes, thereby mitigating a vertical crosstalk phenomenon.

DESCRIPTION OF DRAWINGS

The accompanying figures to be used in the description of embodiments of the present application or prior art will be described in brief to more clearly illustrate the technical solutions of the embodiments or the prior art. The accompanying figures described below are only part of the embodiments of the present application, from which figures those skilled in the art can derive further figures without making any inventive efforts.

DETAILED DESCRIPTION OF PREFERRED EMBODIMENTS

The embodiments of the present application are described in detail hereinafter. Examples of the described embodiments are given in the accompanying drawings. It should be noted that the following embodiments are intended to illustrate and interpret the present application, and shall not be construed as causing limitations to the present application. Similarly, the following embodiments are part of the embodiments of the present application and are not the whole embodiments, and all other embodiments obtained by those skilled in the art without making any inventive efforts are within the scope protected by the present application.

In description of the present application, it should be understood that terms that indicates orientation or relation of position such as "center", "longitudinal", "lateral", "length", "width", "thickness", "upper", "lower", "front", "rear", "left", "right", "vertical", "horizontal", "top", "bottom", "interior", "exterior", "clockwise", "counterclockwise" are based on orientation or relation of position accompanying drawings show. They are simply for purpose of description of the present application and simplifying of description, and do not mean or suggest the devices or components have a specified orientation and constructed and operated in a specified orientation; therefore, it should not be understood as limitation of the present application. Furthermore, terms "first" and "second" are used simply for purpose of description and cannot be understood to mean or suggest relative importance or implicitly mean amount of the technical features. Therefore, features with terms "first" and "second" can mean or implicitly include one or more of the features. In description of the present application, "multiple" means two or more unless otherwise clearly and concretely specified.

In description of the present application, unless otherwise clearly defined or specified, it should be explained that terms such as "mount", "connect", "secure", etc. should be understood in a wide sense. For example, it can be fixedly connected, detachably connected, or one-piece; it can be mechanically connected, electrically connected, or mutually communicable; it can be directly connected or indirectly connected through an intermediate media; and it can be an internal connection of two devices or effect relation of two devices to each other. For a person of ordinary skill in the art, specific meaning of the above-mentioned terms in the present application can be understood according to specific conditions.

In the present application, unless otherwise clearly specified and limited, that a first feature is "on" or "below" a second feature can include that the first feature directly contacts the second feature, and also can include that the first feature contacts the second feature through other features between them rather than their direct contact. Furthermore, that a first feature is "on top of", "above", and "on an upper side of" a second feature includes that the first feature is on right top of and obliquely above the second feature, or merely means that a horizontal height of the first feature is greater than that of the second feature. That a first feature is "at a bottom of", "below", and "on an lower side of" a second feature includes that the first feature is at the right bottom of and obliquely below the second feature, or merely means that a horizontal height of the first feature is less than that of the second feature.

Contents disclosed below provide many different embodiments or examples to realize different structures according to the present application. For the purpose of simplifying description of the present application, contents below describe parts and configuration of specific examples. Naturally, they are merely for illustration and do not intend to limit the present application. Furthermore, reference numerals and/or letters can be repeated in different examples of the present application, and this repeat is for the purse of simplification and clearness, not indicating relations between various embodiments and/or configurations under discussion. Furthermore, the present application provides examples of various specific processes and materials; however, a person of ordinary skill in the art can think of applications of other processes and/or materials.

Figure 1:
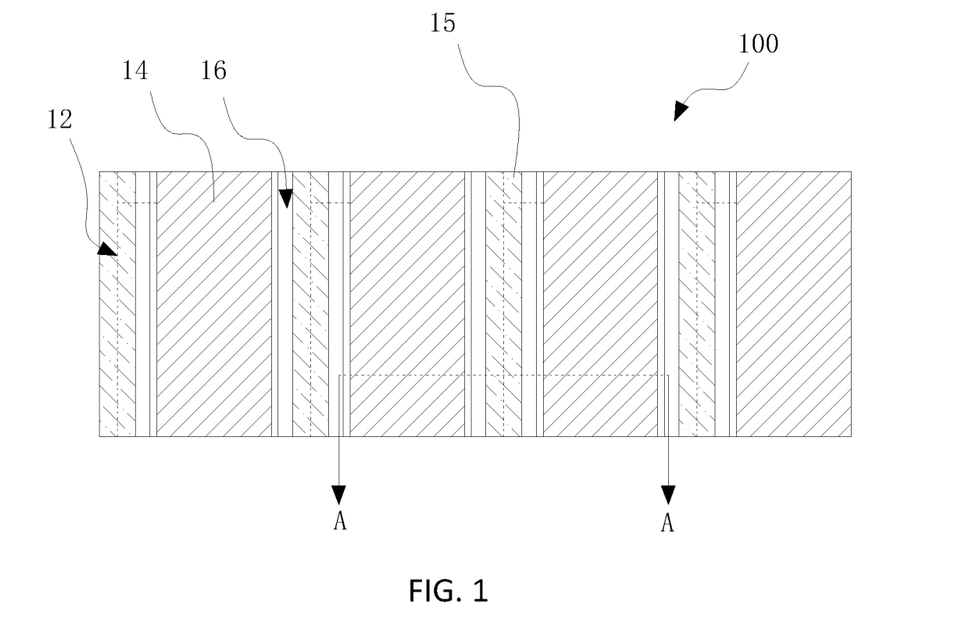
FIG. 1 is a top view of a structural schematic diagram of an array substrate according to a first embodiment of the present application.
Figure 2:
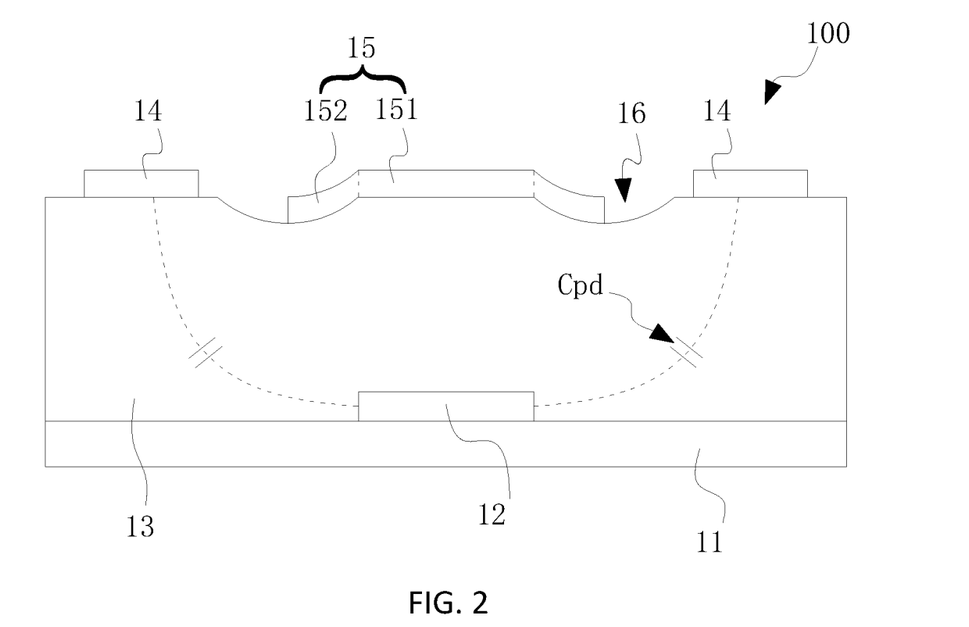
FIG. 2 is a sectional view along line AA in FIG. 1.

Referring to FIG. 1 and FIG. 2, FIG. 1 is a top view of a structural schematic diagram of an array substrate according to a first embodiment of the present application, and FIG. 2 is a sectional view along line AA in FIG. 1. The first embodiment of the present application provides an array substrate 100 that includes a base 11, a plurality of data lines 12, an insulating layer 13, a plurality of pixel electrodes 14, and a plurality of shield electrodes 15.

The base 11 can be a substrate, e.g. a glass substrate and a plastic substrate, and it can also be a device board consisting of a substrate, thin film transistors, scan lines, an insulating layer, etc. The data lines 12 are disposed on the base 11. The insulating layer 13 is disposed on the data lines 12. The pixel electrodes 14 are disposed on the insulating layer 13. The shield electrodes 15 are disposed in a same layer as the pixel electrodes 14, and one of the shield electrodes 15 is located between two adjacent pixel electrodes 14 and disposed corresponding to the data lines 12.

The shield electrodes 15 include an electrode main part 151 and an extension part 152, the electrode main part 151 is located between adjacent pixel electrodes 14, and the extension part 152 extends from the electrode main part 151 in a direction toward the adjacent pixel electrodes 14.

Wherein, a groove 16 is formed in the insulating layer 13, and the groove 16 is located between the electrode main part 151 and the pixel electrodes 14. The extension part 152 extends into the groove 16. At least a part of a vertical projection of the extension part 152 on a plane of the data lines 12 is located on an outside of the data lines 12.

The array substrate 100 according to the present application adopts the groove 16 formed in the insulating layer 13 that corresponds to a part between the electrode main part 151 and the pixel electrodes 14, and the extension part 152 of the shield electrodes 15 bends downward and covers at least a part of the groove 16. When the data lines 12 perform signal transmission with the pixel electrodes 14, electric field lines are produced in a space between the data lines 12 and the pixel electrodes 14, and therefore coupling capacitance Cpd is produced. The extension part 152 is disposed in the electric field space and blocks transmission of at least a part of the electric field lines, decreasing a capacitive coupling effect between the data lines 12 and the pixel electrodes 14, and therefore mitigating a vertical crosstalk phenomenon.

In the array substrate 100 according to the first embodiment, the array substrate 100 further includes structures (not shown) such as a thin film transistor layer and scan lines disposed on the base 11, and because the thin film transistor structure layer and the scan lines are conventional technology, a detailed description is omitted here.

In the array substrate according to the first embodiment, the electrode main part 151 of the shield electrodes 15 and the pixel electrodes 14 have a same height with respect to the base 11, and a height of a free end of the extension part 152 is less than that of the pixel electrodes 14.

The extension part 152 at least covers a lowest point of the groove 16. Such a configuration maximizes a shield effect of the shield electrodes 15.

In the first embodiment, a free end part of the extension part 152 is located at the lowest point of the groove 16. Obviously, in some embodiments, a free end of the extension part 152 can also extend not to the lowest point of the groove 16, or may extend beyond the lowest point of the groove 16.

In the first embodiment, the data lines 12 and the pixel electrodes 14 produce an electric field. The data lines 12 are located below the shield electrodes 15, and the extension part 152 of the shield electrodes 15 is in the electric field space. Therefore, the electric field blocking effectiveness of the extension part 152 is directly proportional to a depth of the groove 16. The deeper the groove 16 is, the deeper the extension part 152 extends into the electric field space, and the greater the shield effect becomes. If the groove 16 penetrates through all the way to the insulating layer 13 in a depth direction with the extension part 152 extending to the bottom of the groove 16, the shield electrodes 15 can completely block transmission of the electric field lines of the data lines 12 and pixel electrodes 14, therefore preventing the capacitance coupling effect, and completely resolving the technical problem of vertical crosstalk.

However, considering width limitations between the data lines 12 and the pixel electrodes 14 and an extent of shielding required, the depth of the groove 16 according to the present embodiment can be between one tenth to half a thickness of the insulating layer 13. For example, one ninth, one eighth, one seventh, one sixth, one fifth, a quarter, one third, etc. Obviously, in some embodiments, the depth of the groove 16 can also be less than one tenth, such as one twelfth, or greater than half, such as two thirds.

Optionally, a shape of a section of the groove 16 is a circular arc. The circular-arc-shaped groove 16 facilitates formation of the extension part 152. In some embodiments, a shape of the section of the groove 16 can also be an inverted trapezoid, a square, an arc, or others, which is not limited thereto.

Furthermore, a shape and a size of each of the extension part 152 is the same. Such a configuration makes the coupling capacitance produced between each of the data lines 12 and the pixel electrodes 14 on two sides thereof the same, therefore preventing the problem of vertical crosstalk.

In the array substrate 100 according to the first embodiment, the shield electrodes 15 and the pixel electrodes 14 have the same material. Such a configuration makes the shield electrodes 15 and the pixel electrodes 14 capable of being manufactured using a same photolithography process, thereby simplifying processing steps.

In the array substrate 100 according to the first embodiment of the present application, the insulating layer 13 is an organic insulating layer. In some embodiments, the insulating layer 13 can also be an inorganic layer.

A manufacturing process of the array substrate 100 according to the first embodiment is:

First, providing a base 11, and sequentially forming a buffer layer, an active layer, a first insulating layer, a gate metal layer, a second insulating layer, and a source and drain metal layer on the base 11, wherein the source and drain metal layer includes data lines 12.

Second, forming an insulating layer 13 on the source and drain metal layer.

Then, forming a groove 16 in the insulating layer 13 using a mask, wherein an opening of the mask corresponds to a preset area of the groove 16 in the insulating layer 13. Wherein, the mask can be used to independently form the groove 16, and it can also be an opening to form the groove 16 added on a basis of a mask to form a via hole of the insulating layer 13.

At last, forming a conducting layer on the insulating layer 13, and forming pixel electrodes 14 and shield electrodes 15 using a photolithography process. An electrode main part 151 of the shield electrodes 15 is located between two adjacent grooves 16, and an extension part 152 is located in the groove 16.

A manufacturing process according to the present embodiment is finished like this.

Figure 3:
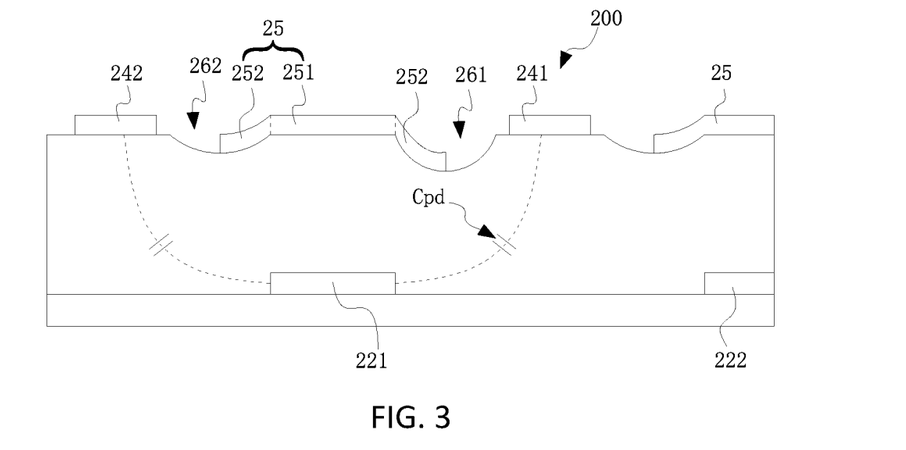
FIG. 3 is a structural schematic diagram of an array substrate according to a second embodiment of the present application.

Referring to FIG. 3, an array substrate 200 according to a second embodiment of the present application is different from the array substrate 100 according to the first embodiment in that:

Pixel electrodes include a first pixel electrode 241 and a second pixel electrode 242, the first pixel electrode 241 is a blue pixel electrode, and the second pixel electrode 242 includes a red pixel electrode and a green pixel electrode. Data lines 22 include a first data line 221 and a second data line 222, the first data line 221 is connected to the first pixel electrode 241, and the second data line 222 is connected to the second pixel electrode 242. Grooves include a first groove 261 and a second groove 262, the first groove 261 is correspondingly defined between the first data 221 and the first pixel electrode 241, and the second groove 262 is one of the grooves other than the first groove 261.

A depth of the first groove 261 is greater than a depth of the second groove 262, and an extension depth of an extension part 252 of shield electrodes 25 in the first groove 261 is greater than that in the second groove 262.

The array substrate 200 according to the second embodiment adds the above-mentioned technical features in comparison with the array substrate 100 according to the first embodiment, other structures are consistent with the array substrate 100 according to the first embodiment, and the detailed description is omitted here.

In the second embodiment, the shield electrodes 25 include an electrode main part 251. Configuring the extension depth of the extension part 252 of the shield electrodes 25 in the first groove 261 to be greater than that in the second groove 262 further decreases coupling capacitance of the first pixel electrode 241 and the first data line 221. When a pixel is on an initial side of a scan, assuming that the blue pixel electrode 241 is at a positive frame, a voltage of the blue pixel electrode 241 is coupled by its data line (the first data line 221) as well as by the other data line (second data line 222) and the pixel is lit. Coupling capacitance of the blue pixel electrode 241 is smaller, hence brightness of the blue pixel electrode 241 itself is decreased, and a white balance itself would decrease a voltage of the data line of the blue pixel electrode 241 and therefore decrease its brightness, thereby regulating color temperature. Therefore, through the above-described configuration to decrease blue brightness, the voltage of the data line (first data line 221) of the blue pixel electrode 241 does not need to be changed, hence the voltage of all data lines 22 are ensured to maintain the same, thereby not only achieving an effect of an automated white balance, but also the prevention of vertical crosstalk due to inconsistent voltage of the data lines 22. That is, an order of the blue pixel can be decreased such that the voltage of the data lines 22 is relatively consistent, thereby effectively decreasing vertical crosstalk.

Figure 4:
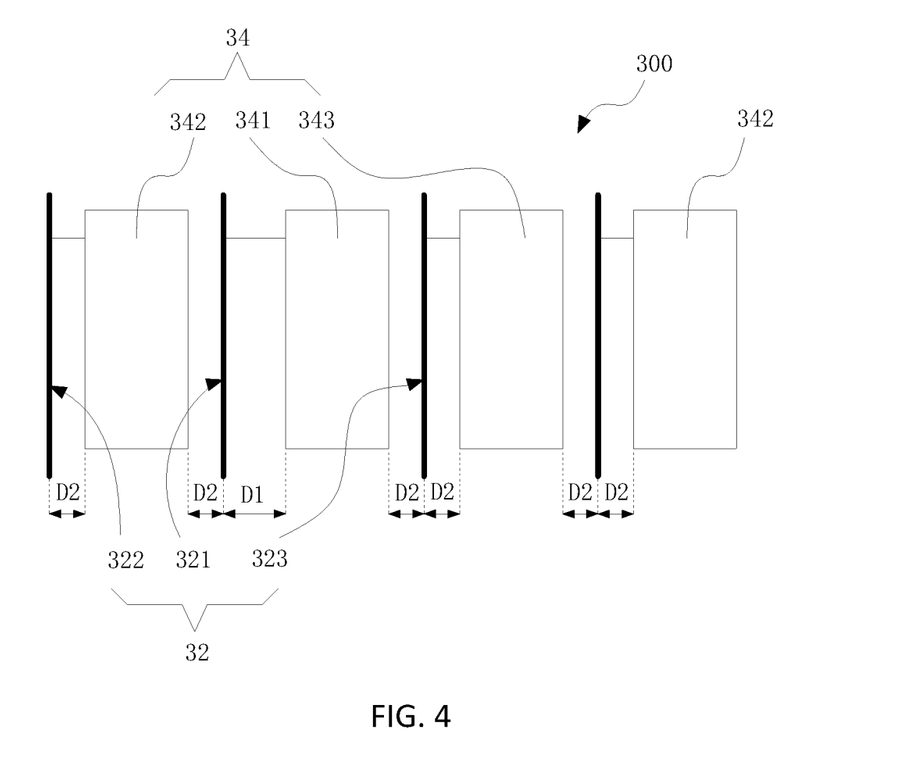
FIG. 4 is a top view of a structural schematic diagram of pixel electrodes and data lines of an array substrate according to a third embodiment of the present application.

Referring to FIG. 4, an array substrate 300 according to a third embodiment of the present application is different from the array substrate 100 according to the first embodiment in that:

A plurality of data lines 32 include a first data line 321 and a second data line 322. A plurality of pixel electrodes 34 are arranged connecting to the plurality of data lines 32. The data lines 32 and the pixel electrodes 34 are alternately arranged. The plurality of pixel electrodes 34 include a blue pixel electrode 341 and a non-blue pixel electrode.

The non-blue pixel electrode is a red pixel electrode 342 or a green pixel electrode 343. The plurality of data lines 32 further include a plurality of third data lines 323, the second data line 322 is electrically connected to one of the red pixel electrode 342 or the green pixel electrode 343, and the third data lines 323 are electrically connected to the other red pixel electrode 342 or green pixel electrode 343. That is, when the second data line 322 is electrically connected to the red pixel electrode 342, the third data lines 323 are electrically connected to the green pixel electrode 343.

The first data line 321 is electrically connected to the blue pixel electrode 341. The blue pixel electrode 341 and the first data line 321 electrically connected thereto have a first horizontal distance D1 therebetween. The non-blue pixel electrode and an adjacent data line 32 have a second horizontal distance D2 therebetween. The blue pixel electrode 341 and an adjacent second data line 322 also have the second horizontal distance D2 therebetween. The first horizontal distance D1 is greater than the second horizontal distance D2.

In the third embodiment, three situations are included wherein the non-blue pixel electrode and an adjacent data line 32 have the second horizontal distance D2 therebetween: the non-blue pixel electrode and an adjacent first data line 321 have the second horizontal distance D2 therebetween, the non-blue pixel electrode and an adjacent second data line 322 have the second horizontal distance D2 therebetween, and the non-blue pixel electrode and an adjacent third data line 323 have the second horizontal distance D2 therebetween.

Furthermore, capacitance coupling is under a premise that quantity of electric charge does not exchange. When a voltage at one terminal changes, a voltage at the other terminal increases correspondingly, and a value of the increased voltage is proportional to a capacitance of the two terminals.

In the array substrate 300 according to the third embodiment of the present application, the first horizontal distance D1 of the blue pixel electrode 341 to which a blue pixel corresponds and the first data line 321 electrically connected thereto is configured to be greater than the second horizontal distance D2 of the non-blue pixel electrode and an adjacent data line 32. In such configuration, when a pixel is on an initial side of the scan, assuming that the blue pixel is at a positive frame, voltage of the blue pixel electrode 341 is coupled by its first data line 321 as well as by the second data line 322 (negative frame) and the pixel is lit. The blue pixel electrode 341 is farther from its first data line 321, the capacitance is smaller, and because coupling is proportional to capacitance, brightness of the blue pixel itself is decreased. Meanwhile, as white balance decreases brightness by reducing voltage of the first data line 321 of the blue pixel electrode 341, this can be used to regulate color temperature.

Therefore, a design of the present application to decrease blue brightness does not need to change the voltage of the first data line 321 of the blue pixel electrode 341, and the voltage of all data lines 32 is ensured to be the same, thereby not only achieving an effect of automated white balance, but also preventing vertical crosstalk due to inconsistent voltage of the data lines 32.

Optionally, a difference between the first horizontal distance D1 and the second horizontal distance D2 is between 0.1 micrometer (inclusive) and 1 micrometer (inclusive). Furthermore, the difference between the first horizontal distance D1 and the second horizontal distance D2 is one of 0.2 micrometer (um), 0.3 um, 0.4 um, 0.5 um, 0.6 um, 0.7 um, 0.8 um, or 0.9 um.

The array substrate 300 according to the third embodiment adds the above-mentioned technical features in comparison with the array substrate 100 according to the first embodiment, other structures are consistent with the array substrate 100 according to the first embodiment, and detailed description is omitted here.

In the third embodiment, when a pixel is on an initial side of the scan, assuming that the blue pixel electrode 341 is during a positive frame, voltage of the blue pixel electrode 341 is coupled by its data line (first data line 321) as well as by the other data line (second data line 322) and the pixel is lit. The blue pixel electrode 341 is farther from its first data line 321, its capacitance is smaller, because coupling capacitance is proportional to its capacitance, brightness of the blue pixel electrode 341 itself is decreased, and white balance itself would decrease voltage of the data line of the blue pixel electrode 341 and therefore decrease its brightness, thereby regulating color temperature. Therefore, through the above-described configuration to decrease blue brightness, voltage of the data line (first data line 321) of the blue pixel electrode 341 does not need to be changed, and hence voltage of all data lines 32 is ensured to maintain the same, thereby not only achieving an effect of an automated white balance, but also preventing vertical crosstalk due to inconsistent voltage of the data lines 32. That is, an order of the blue pixel can be decreased such that voltage of the data lines 32 is relatively consistent, thereby effectively decreasing vertical crosstalk.

In some embodiments, the third embodiment can also be modified on the basis of the second embodiment, that is, the third embodiment includes structural features of the second embodiment.

Figure 5:
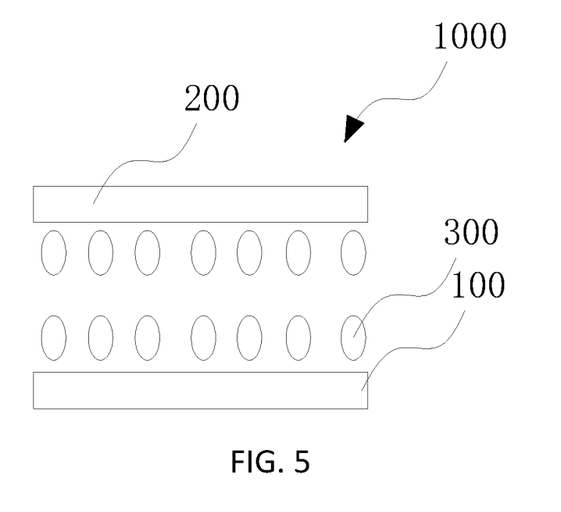
FIG. 5 is a structural schematic diagram of a display panel according to an embodiment of the present application.

Referring to FIG. 5, the present application further relates to a display panel 1000 that includes an array substrate 100, a color filter substrate 200, and liquid crystals 300, and the array substrate 100 includes:

A base; data lines disposed on the base; an insulating layer disposed on the data lines; pixel electrodes disposed on the insulating layer; and shield electrodes disposed in a same layer as the pixel electrodes, wherein the shield electrodes are located between adjacent ones of the pixel electrodes and disposed corresponding to the data lines, the shield electrodes include an electrode main part and an extension part, the electrode main part is located between adjacent pixel electrodes, and the extension part extends from the electrode main part in a direction toward the adjacent pixel electrodes; wherein a groove is formed in the insulating layer, the groove is located between the electrode main part and the pixel electrodes, the extension part extends into the groove, and at least a part of a vertical projection of the extension part on a plane of the data lines is located on an outside of the data lines.

In the display panel according to an embodiment of the present application, the extension part at least covers a lowest point of the groove.

In the display panel according to an embodiment of the present application, a width of each of the extension part is same.

It should be explained that a structure of an array substrate of the display panel according to the present embodiment is consistent with a structure of the array substrate of the above-mentioned first, second, or third embodiment, specific contents can be found in the above-mentioned embodiments of the array substrate, and detailed description is omitted here.

An array substrate and a display panel according to the present application adopt a groove formed in an insulating layer at a part between a shield main part and a pixel electrode, and an extension part of a shield electrode bends downward and covers at least a part of the groove. When data lines and pixel electrodes begin to operate, electric field lines are produced in a space between the data lines and the pixel electrodes, and the extension part is disposed in the electric field space, blocking transmission of at least a part of the electric lines, which decreases a capacitance coupling effect between the data lines and the pixel electrodes, thereby mitigating a vertical crosstalk phenomenon.

The foregoing describes an array substrate and a display panel according to embodiments of the present application in detail. It should be understood that illustrative embodiments described above are descriptive, intended to facilitate understanding of the approach and main idea of the present application, and not intended to limit the present application. Description of features or aspects in each illustrative embodiment should generally be considered to apply to similar features or aspects of other illustrative embodiments. Although illustrative embodiments describe the present application, they can suggest to those skilled in the art making variations and modifications. The present application intends to include the variations and modifications within the scope of the appended claims, and many changes and modifications to the described embodiments can be carried out without departing from the scope and the spirit of the present application that is intended to be limited only by the appended claims.

What is claimed is:

1. An array substrate, comprising:
a base;
a plurality of data lines disposed on the base;
an insulating layer disposed on the data lines;
a plurality of pixel electrodes disposed on the insulating layer; and
a plurality of shield electrodes disposed in a same layer as the pixel electrodes;
wherein one of the shield electrodes is located between two adjacent pixel electrodes and disposed corresponding to one of the data lines, the shield electrodes comprise an electrode main part and an extension part, the electrode main part is located between adjacent pixel electrodes, and the extension part extends from the electrode main part in a direction toward the adjacent pixel electrodes;
wherein grooves are formed in the insulating layer, the grooves are located between the electrode main part and the pixel electrodes, the extension part extends into the grooves, and at least a part of a vertical projection of the extension part on a plane of the data lines is located on an outside of the data lines;
wherein the pixel electrodes include a first pixel electrode and a second pixel electrode, the first pixel electrode is a blue pixel electrode, and the second pixel electrode includes a red pixel electrode and a green pixel electrode; the data lines include a first data line and a second data line, the first data line is electrically connected to the first pixel electrode, and the second data line is connected to the second pixel electrode; the grooves include a first groove and a second groove, the first groove is correspondingly defined between the first data line and the first pixel electrode, and the second groove is one of the grooves other than the first groove; and
wherein a depth of the first groove is greater than a depth of the second groove, and an extension depth of the extension part of the shield electrodes in the first groove is greater than that in the second groove.

2. The array substrate as claimed in claim 1, wherein the extension part at least covers a lowest point of the groove.

3. The array substrate as claimed in claim 2, wherein a free end part of the extension part is located at the lowest point of the groove.

4. The array substrate as claimed in claim 1, wherein the shield electrodes and the pixel electrodes have a same material.

5. The array substrate as claimed in claim 1, wherein the insulating layer is an organic insulating layer.

6. The array substrate as claimed in claim 1, wherein a shape of a section of the groove is a circular arc.

7. The array substrate as claimed in claim 1, wherein
the blue pixel electrode and the first data line electrically connected thereto have a first horizontal distance therebetween;
the red pixel electrode or the green pixel electrode and an adjacent data line, and the blue pixel electrode and an adjacent second data line have a second horizontal distance therebetween, respectively; and
the first horizontal distance is greater than the second horizontal distance.

8. The array substrate as claimed in claim 7, wherein the plurality of data lines further comprises a third data line, the second data line is electrically connected to one of the red pixel electrode or the green pixel electrode, and the third data line is electrically connected to the other red pixel electrode or the other green pixel electrode.

9. A display panel, comprising an array substrate, wherein the array substrate comprises:
a base;
a plurality of data lines disposed on the base;
an insulating layer disposed on the data lines;
a plurality of pixel electrodes disposed on the insulating layer;
a plurality of shield electrodes disposed in a same layer as the pixel electrodes, wherein one of the shield electrodes is located between two adjacent pixel electrodes and disposed corresponding to one of the data lines, the shield electrodes comprise an electrode main part and an extension part, the electrode main part is located between adjacent pixel electrodes, and the extension part extends from the electrode main part in a direction toward the adjacent pixel electrodes;
wherein grooves are formed in the insulating layer, the grooves are located between the electrode main part and the pixel electrodes, the extension part extends into the grooves, and at least a part of a vertical projection of the extension part on a plane of the data lines is located on an outside of the data lines;
wherein the pixel electrodes include a first pixel electrode and a second pixel electrode, the first pixel electrode is a blue pixel electrode, and the second pixel electrode includes a red pixel electrode and a green pixel electrode; the data lines include a first data line and a second data line, the first data line is electrically connected to the first pixel electrode, and the second data line is connected to the second pixel electrode; the grooves include a first groove and a second groove, the first groove is correspondingly defined between the first data line and the first pixel electrode, and the second groove is one of the grooves other than the first groove; and
wherein a depth of the first groove is greater than a depth of the second groove, and an extension depth of the extension part of the shield electrodes in the first groove is greater than that in the second groove.

10. The display panel as claimed in claim 9, wherein the extension part at least covers a lowest point of the groove.

11. The display panel as claimed in claim 10, wherein a free end part of the extension part is located at the lowest point of the groove.

12. The display panel as claimed in claim 9, wherein the shield electrodes and the pixel electrodes have a same material.

13. The display panel as claimed in claim 9, wherein the insulating layer is an organic insulating layer.

14. The display panel as claimed in claim 9, wherein a shape of a section of the groove is a circular arc.

15. The display panel as claimed in claim 9,
the blue pixel electrode and the first data line electrically connected thereto have a first horizontal distance therebetween, the red pixel electrode or the green pixel electrode and an adjacent data line, and the blue pixel electrode and an adjacent second data line, have a second horizontal distance therebetween, respectively, and the first horizontal distance is greater than the second horizontal distance.

16. The display panel as claimed in claim 15, wherein the plurality of data lines further comprises a third data line, the second data line is electrically connected to one of the red pixel electrode or the green pixel electrode, and the third data line is electrically connected to the other red pixel electrode or the other green pixel electrode.

17. A display panel, comprising an array substrate, wherein the array substrate comprises:
a base;
a plurality of data lines disposed on the base;
an insulating layer disposed on the data lines;
a plurality of pixel electrodes disposed on the insulating layer;
a plurality of shield electrodes disposed in a same layer as the pixel electrodes, wherein one of the shield electrodes is located between two adjacent pixel electrodes and disposed corresponding to one of the data lines, the shield electrodes comprise an electrode main part and an extension part, the electrode main part is located between adjacent pixel electrodes, and the extension part extends from the electrode main part in a direction toward the adjacent pixel electrodes;
wherein grooves are formed in the insulating layer, the grooves are located between the electrode main part and the pixel electrodes, the extension part extends into the grooves, and at least a part of a vertical projection of the extension part on a plane of the data lines is located on an outside of the data lines;
wherein plurality of data lines include a first data line and a second data line; the plurality of pixel electrodes are arranged connecting to the plurality of data lines; the data lines and the pixel electrodes are alternately arranged; the plurality of pixel electrodes include a blue pixel electrode and a non-blue pixel electrode;
wherein the non-blue pixel electrode is a red pixel electrode or a green pixel electrode;
the plurality of data lines further include a plurality of third data lines, the second data line is electrically connected to one of the red pixel electrode or the green pixel electrode, and the third data lines are electrically connected to the other red pixel electrode or green pixel electrode;
wherein the first data line is electrically connected to the blue pixel electrode; the blue pixel electrode and the first data line electrically connected thereto have a first horizontal distance D1 therebetween; the non-blue pixel electrode and an adjacent data line have a second horizontal distance D2 therebetween; the blue pixel electrode and an adjacent second data line also have the second horizontal distance D2 therebetween; the first horizontal distance D1 is greater than the second horizontal distance D2.

18. The display panel as claimed in claim 17, wherein the non-blue pixel electrode is a red pixel electrode or a green pixel electrode, the plurality of data lines further comprises a third data line, the second data line is electrically connected to one of the red pixel electrode or the green pixel electrode, and the third data line is electrically connected to the other red pixel electrode or the other green pixel electrode.

\* \* \* \* \*